(12) United States Patent
Xiong et al.

(10) Patent No.: US 8,560,980 B2
(45) Date of Patent: Oct. 15, 2013

(54) OPTIMAL CHIP ACCEPTANCE CRITERION AND ITS APPLICATIONS

(75) Inventors: Jinjun Xiong, White Plains, NY (US); Vladimir Zolotov, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/946,950

(22) Filed: Nov. 16, 2010

(65) Prior Publication Data
US 2012/0124535 A1 May 17, 2012

(51) Int. Cl.
G06F 17/50 (2006.01)

(52) U.S. Cl.
USPC .............. 716/56; 716/111; 716/138

(58) Field of Classification Search
USPC .......... 716/105, 106, 108, 111, 113, 136
See application file for complete search history.

(56) References Cited

U.S. PATENT DOCUMENTS

| | | | |
|---|---|---|---|
| 5,950,070 | A | 9/1999 | Razon |
| 6,070,004 | A | 5/2000 | Prein |
| 6,922,600 | B1 | 7/2005 | Conrad et al. |
| 7,560,946 | B2 | 7/2009 | Bickford et al. |
| 7,620,921 | B2 | 11/2009 | Foreman et al. |
| 7,682,842 | B2 | 3/2010 | Desineni et al. |
| 2006/0036402 | A1 | 2/2006 | Deller |
| 2009/0039912 | A1 | 2/2009 | Bickford |
| 2009/0063564 | A1 | 3/2009 | Lahner et al. |
| 2009/0182522 | A1* | 7/2009 | Visweswariah et al. ...... 702/117 |
| 2009/0235217 | A1 | 9/2009 | Buck et al. |
| 2011/0106497 | A1* | 5/2011 | Visweswariah et al. ...... 702/182 |
| 2012/0010837 | A1 | 1/2012 | Habitz |

OTHER PUBLICATIONS

Jinjun Xiong, Vladimir Zolotov, Chandu Visweswariah, Peter A. Habiz "Optimal Margin Computation for At-Speed Test" IBM Systems and Technology Group, 978-3-9810801-3-1, 2008.*
K Ponnambalam, et al. "Yield optimization with correlated design parameters and non-symmetrical marginal distributions" Circuits and Systems, 2003. ISCAS '03.
M.Nomani,et al."Statistical Approach for Yield Optimization for Minimum Energy Operation in Subthreshold Circuits Considering Variability Issues"IEEE Transactions on vol. 23, Dec. 2009.
P. Feldmann, et al."Integrated circuit quality optimization using surface integrals", IEEE Transactions on vol. 12, Issue: 12, 1993.

(Continued)

Primary Examiner — Vuthe Siek
Assistant Examiner — Brian Ngo
(74) Attorney, Agent, or Firm — Preston J. Young; Otterstedt, Ellenbogen & Kammer, LLP

(57) ABSTRACT

At least one target metric is identified for an integrated circuit chip design for which manufacturing chip testing is to be optimized. At least one surrogate metric is also identified for the integrated circuit chip design for which manufacturing chip testing is to be optimized. A relationship between the at least one target metric and the at least one surrogate metric is modeled using a general joint probability density function. A chip disposition criterion is determined based on the general joint probability density function. The chip disposition criterion determines, for a given physical chip putatively manufactured in accordance with the design, based on the at least one surrogate metric for the given physical chip, whether the given physical chip is to be accepted or discarded during the manufacturing chip testing.

25 Claims, 9 Drawing Sheets

(56) References Cited

OTHER PUBLICATIONS

J. M. Wojciechowski, et al. "Design centering using an approximation to the constraint region", IEEE Transactions on vol. 51, Issue: 3, 2004.

Norman Elias "Acceptance sampling: an efficient, accurate method for estimating and optimizing parametric yield". IEEE Journal of vol. 29, Issue: 3, 1994.

Mohcene Mezhoudi, et al. "A new method of yield maximization". Circuits and Systems, 1997. Proceedings of the 40th Midwest Symposium on Publication Year: 1997.

J. Xiong, et al. Criticality computation in parameterized statistical timing. Proc. 2006 Design Automation Conference, pp. 63-68, Jul. 2006. San Francisco, CA.

L.-C. Wang, et al. Critical path selection for delay fault testing based . . . timing model. IEEE Transactions on Computer-Aided Design of ICs and Systems, pp. 1550-1565, 2004.

V. Zolotov, J. Xiong, H. Fatemi, and C. Visweswariah. Statistical path selection for at-speed test. ICCAD, Nov. 2008. San Jose, CA.

Method and apparatus for on chip measurement of path sensitive ring oscillator. IP Com Prior Art Database Discl. IPCOM000014724D (Abstr) Nov. 1, 2000.

P. S. Zuchowski, P. A. Habitz, J. D. Hayes, and J. H. Oppold. Process and environmental variation impacts on ASIC timing. ICCAD, pp. 336-342, Nov. 2004. San Jose, CA.

V. Iyengar, et al. At-speed structural test for high-performance ASICs. ITC, pp. 2.4:1-10, Oct. 2006. Santa Clara, CA.

P. Aspell, et. al. Production testing and quality assurance of the cms preshower front-end chips—pace3. pp. 182-186, Sep. 2005.

J. Xiong, et al. Optimal test margin computation for at-speed structural test. IEEE Transactions on Computer-Aided Design of ICs and Systems, 28:1414-1423, Sep. 2009.

T.J. Chakraborty and V.D. Agrawal. Effective path selection for delay fault testing of sequential circuits. pp. 998-1003, 1997.

J-J. Liou, et al. False-path-aware statistical timing analysis ..for delay testing and timing validation. Proc. 2002. Design Automation Conference, p. 566-569, Jun. 2002.

W. Qiu and et al. K longest paths per gate (KLPG) test generation for scan-based sequential circuits. pp. 223-231, 2004.

Q. Liu et al. Synthesizing a representative critical path for post-silicon delay prediction. Proceedings of the ACM International Symposium on Physical Design, p. 183-190, 2009.

Web description of M. J. Press. Applied multivariate analysis. Dover Publications, 2005, downloaded from doverpublications.com Feb. 28, 2012.

X. Wang, et al. Path-RO: A novel onchip critical path delay measurement under process variations. Proc. International Conference on Computer-Aided Design, Nov. 2008.

H. Chang et al. Statistical timing analysis considering spatial correlations using a single PERT-like traversal. ICCAD, pp. 621-625, Nov. 2003. San Jose, CA.

C. Visweswariah, et al. First-order incremental block-based statistical timing analysis. DAC, pp. 331-336, Jun. 2004. San Diego, CA.

R. R Rao, et al. Analytical yield prediction considering leakage/performance correlation. IEEE Transactions on CAD, pp. 1685-1695, Sep. 2006.

Qunzeng Liu, et al. Capturing Post-Silicon Variations Using a Representative Critical Path, IEEE Transactions . . . of Integrated Circuits and Systems, vol. 29, No. 2, Feb. 2010.

* cited by examiner

TABLE I

YIELD IN PERCENTAGE COMPARISON UNDER $\bar{Q}=1\%$

| DESIGNS | $N$-SIGMA BOX | OPTIMAL BOX | TRUE OPTIMAL |
|---|---|---|---|
| CHIP 1 | 18.2 | 50.8 (177%) | 54.8 (200%) |
| CHIP 2 | 60.0 | 82.3 (37.0%) | 83.1 (38.3%) |
| CHIP 3 | 2.59 | 24.0 (825%) | 34.7 (1234%) |

TABLE II

PQL IN PERCENTAGE COMPARISON WITH YIELD CONSTRAINTS

| YIELD $\overline{Y}$ | 40% | 50% | 60% | 70% | 80% | 90% | 95% |
|---|---|---|---|---|---|---|---|
| $N$-SIGMA BOX | 2.57 | 3.49 | 4.56 | 5.82 | 7.35 | 9.26 | 10.4 |
| OPTIMAL BOX | 0.53<br>79% | 0.95<br>72% | 1.66<br>63% | 2.77<br>52% | 4.47<br>39% | 7.10<br>23% | 9.04<br>13% |
| TRUE OPTIMAL | 0.35<br>86% | 0.71<br>79% | 1.36<br>70% | 2.38<br>59% | 4.0<br>45% | 6.70<br>27% | 8.76<br>16% |

OPTIMAL CHIP ACCEPTANCE CRITERION AND ITS APPLICATIONS

FIELD OF THE INVENTION

The present invention relates to the electrical, electronic and computer arts, and, more particularly, to manufacture and test of integrated circuit chips and the like.

BACKGROUND OF THE INVENTION

A task in manufacturing chip testing is to determine whether a chip should be accepted or discarded, i.e., chip disposition, by measuring a set of surrogate metrics from the chip. The accepted chip is assumed to have its target metrics meeting the customer specification. If the assumption is mistaken, there is a risk of shipping "bad" chips to customers, thus increasing the cost of contracted product quality loss (PQL).

SUMMARY OF THE INVENTION

Principles of the invention provide techniques for optimal chip acceptance criterion and its applications. In one aspect, an exemplary method includes the steps of identifying, for an integrated circuit chip design for which manufacturing chip testing is to be optimized, at least one target metric; identifying, for the integrated circuit chip design for which manufacturing chip testing is to be optimized, at least one surrogate metric; modeling a relationship between the at least one target metric and the at least one surrogate metric using a general joint probability density function; and determining a chip disposition criterion based on the general joint probability density function. The chip disposition criterion determines, for a given physical chip putatively manufactured in accordance with the design, based on the at least one surrogate metric for the given physical chip, whether the given physical chip is to be accepted or discarded during the manufacturing chip testing.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer product including a computer readable storage medium with computer usable program code for performing the method steps indicated (or for obtaining the target and/or surrogate metric(s) identified by a human agent or the like). Furthermore, one or more embodiments of the invention or elements thereof can be implemented in the form of a system (or apparatus) including a memory, and at least one processor that is coupled to the memory and operative to perform exemplary method steps (or for obtaining the target and/or surrogate metric(s) identified by a human agent or the like). Yet further, in another aspect, one or more embodiments of the invention or elements thereof can be implemented in the form of means for carrying out one or more of the method steps described herein (or for obtaining the target and/or surrogate metric(s) identified by a human agent or the like); the means can include (i) hardware module(s), (ii) software module(s), or (iii) a combination of hardware and software modules; any of (i)-(iii) implement the specific techniques set forth herein, and the software modules are stored in a computer-readable storage medium (or multiple such media).

Techniques of the present invention can provide substantial beneficial technical effects. For example, one or more embodiments may provide one or more of the following advantages:

Smooth tradeoff between yield and product quality level through adjusting parameters used in different problem formulations, such as maximize yield subject to contracted product quality loss; or minimize product quality loss subject to given yield constraints.

Theoretically proved optimal chip disposition criteria for any probability distributions between chip target metrics and measured surrogate metrics Efficient close-form solution for optimal chip disposition based on Gaussian distributions between chip target metrics and measured surrogate metrics These and other features and advantages of the present invention will become apparent from the following detailed description of illustrative embodiments thereof, which is to be read in connection with the accompanying drawings.

DETAILED DESCRIPTION OF PREFERRED EMBODIMENTS

Figure 1:
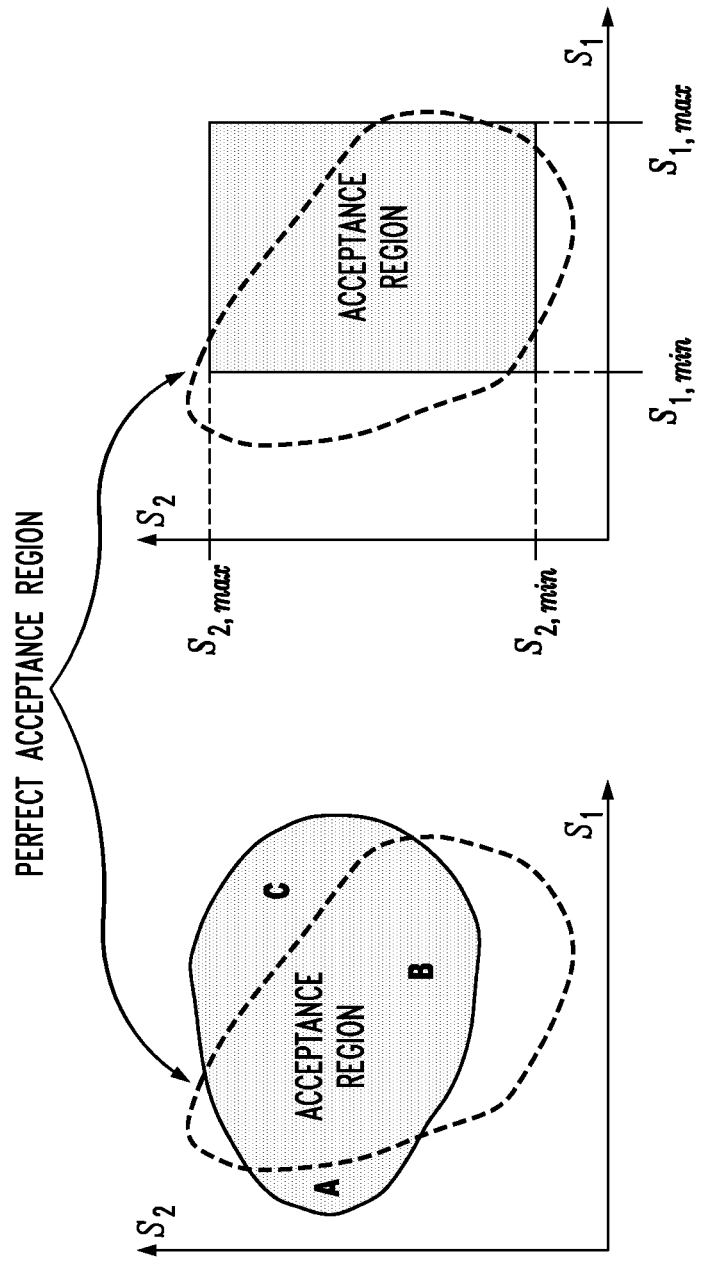
FIG. 1 depicts illustrative acceptance regions.

A chip disposition criterion is used to decide how to accept or discard a chip during chip testing. Its quality directly impacts both manufacturing yield and the contracted-for product quality loss (PQL). The importance becomes even more significant with increasingly large process variations. Research on this subject has, heretofore, been rather limited. One or more embodiments provide a rigorously formulated approach to the optimal chip disposition problem, and/or an elegant solution to this problem. The optimal chip disposition criterion is different from existing industry practices that assume a bounding box-based acceptance criterion. One or more embodiments can find the optimal chip disposition criterion efficiently with much improved yield under the same PQL constraint, or reduced PQL under the same yield constraint.

As noted above, a task in manufacturing chip testing is to determine whether a chip should be accepted or discarded, i.e., chip disposition, by measuring a set of surrogate metrics from the chip. The accepted chip is assumed to have its target metrics meeting the customer specification. If the assumption is mistaken, there is a risk of shipping "bad" chips to customers, thus increasing the cost of contracted product quality loss (PQL).

The target metric is typically difficult (if not impossible) to measure. For example, in most designs, chip frequency is the target metric that is determined by the critical path among billions of paths in the design. Testing the critical path directly is difficult due to (1) high complexity in generating test patterns for a long critical path; (2) non-uniqueness of critical paths in the presence of process variations, as different paths can be critical for chips manufactured under different process conditions; and (3) non-trivial challenge of selecting statistically critical paths. Instead, more easily testable sub-critical paths or ring oscillators have been frequently used to serve as a surrogate metric to help chip disposition.

Chip disposition criteria are ways to decide whether or not to accept a chip based on its measured surrogate metrics. The quality of chip disposition criteria directly impacts both manufacturing yield and the contracted-for PQL. This is particularly so with the increasingly large process variations for nano-scale chip manufacturing.

Most existing solutions were developed in industry as some kind of ad hoc recommendations. In practice, some "magic" threshold values are often tabulated to compare against those selected surrogate metrics. Chips with their surrogate metrics conforming to all those threshold values are accepted; otherwise, chips are discarded. For example, a foundry used to check each chip's four-corner ring oscillator frequencies to ensure that they were within a valid region for the chip to be accepted. These fixed threshold values are generally design independent, and hence are not a good indicator of each chip's target metric. Recently, techniques for dynamically adjusting the threshold values based on each individual chip's characteristics have been reported. However, there is no valid reason that the acceptance region should be bounded by fixed threshold values, not to mention challenges in deciding the optimal threshold values.

Another aspect is improvement in the quality of surrogate metrics so that they become as close to the target metric as possible. Exemplary approaches include selecting good quality paths, synthesizing a representative critical path, or even directly measuring on-chip process parameters or path frequencies. Nevertheless, all these attempts cannot completely eliminate the gap between surrogate metrics and the target metric, and they still require good quality chip disposition criteria to work properly.

One or more embodiments employ a general joint probability density function (JPDF) to model the relationship between the chip target metrics and surrogate metrics. An optimal chip disposition criterion can be obtained to maximize the yield under a given PQL constraint. Two conclusions from this derivation are that (1) the solution provided by one or more embodiments is applicable to all probability distributions; and (2) the optimal acceptance region is generally not the one given by fixed threshold values. This theoretical result can be applied to chip frequency testing based on Gaussian distribution. For any given number of surrogate metrics, one or more embodiments efficiently compute an optimal chip disposition function, which takes measurements of these surrogate metrics as input and returns Boolean true or false as output for accepting or discarding a chip. The target chip frequency metric can be evaluated by either setup tests or hold tests or both. Numerical experimental results show that one or more embodiments can improve yield significantly when compared to the existing ad hoc threshold-based chip disposition criteria.

In the presence of increasingly large process and environmental variations, a lot of design metrics are more suitably modeled as a random distribution than a constant value. Therefore, one or more embodiments employ a general joint probability density function (JPDF) to model the relationship between the chip target metrics and surrogate metrics.

A chip disposition criterion can be abstractly modeled as a Boolean function that takes each chip's n surrogate metrics as input and returns true or false as output to indicate whether such a chip should be accepted or discarded. The acceptance region is the subspace as defined in the n-dimensional surrogate metric spaces where the Boolean disposition function returns true. There are many possible acceptance regions with different quality, and each disposition function defines one particular acceptance region.

The quality of a chip disposition criterion is measured by its corresponding chip yield Y and PQL Q that are, respectively, defined as follows. Yield is the fraction of manufactured chips that are accepted by the chip disposition criterion; and PQL is the fraction of manufactured chips that do not meet its specification but are still accepted by the chip disposition criteria.

A perfect chip disposition criterion achieves the maximum yield with zero PQL. Furthermore, the perfect acceptance region is defined as the region within which the target chip metric always meets its specification, while beyond which the target chip metric does not. The perfect acceptance region for a design should thus be unique, and a perfect chip disposition criterion should correspond to this perfect acceptance region.

FIG. 1 illustrates these concepts in a two-dimensional surrogate metric space. The region as enclosed by the dotted line on both the left- and right-hand sides of FIG. 1 is the perfect acceptance region, while the region as enclosed by the solid line on the left-hand side of FIG. 1 is one particular acceptance region as defined by one particular chip disposition function. For example, existing industry practices typically define the chip disposition criteria as some kind of bounding boxes along each surrogate metric axis, where each surrogate metric is confined within two upper and lower bound threshold values. The corresponding acceptance region in the two-dimensional space is shown in solid lines on the right-hand side of FIG. 1.

In most cases, it is impossible to obtain the perfect acceptance region by only measuring those surrogate metrics, as a gap always exists between chip target metrics and surrogate metrics. One or more embodiments find an optimal chip disposition criterion by measuring only those surrogate metrics such that the yield is maximized under a given PQL constraint Q. The following problem formulation is pertinent:

Formulation 1:

Given a design with its relationship between chip target metrics and measured surrogate metrics modeled by a general JPDF, under a required PQL constraint, find an optimal chip disposition criterion such that the yield is maximized. The dual formulation is also valid that minimizes the PQL under a given yield constraint.

However, finding the optimal chip disposition criterion is not easy, because there are unlimited possibilities in defining various chip disposition functions with different acceptance regions. Attempting to enumerate all these possibilities to find the optimal solution is not feasible.

In practice, the greater the number of surrogate metrics, the more information that can be inferred about the target metrics, and hence the better the testing quality. For illustrative purposes, assume the chip target metrics as chip slacks $s_C$, and the n surrogate metrics S as testing path slacks. Since slacks are defined as the difference between required cycle time from the specification and achievable cycle time, a good chip should have positive target chip slacks, i.e., $s_C$>0.

Denote the JPDF of $s_C$ as $p(s_C)$, the JPDF of S as $p(S)$, the JPDF of $s_C$ and S as $p(s_C, S)$, the conditional JPDF of $s_C$ conditional upon S as $p(s_C|S)$, and the conditional JPDF of S conditional upon $s_C$ as $p(S|s_C)$. Note the identities $p(s_C, S) = p(s_C|S)p(S) = p(S|s_C)p(s_C)$. Note also that both $s_C$ and S can be either scalar or vector, but for simplicity of presentation, such notational distinctions are not made explicitly herein (for example, PDF and JPDF are used interchangeably).

For a region R defined in the surrogate metric space, its corresponding yield Y(R) and PQL Q(R) are computed by:

$$Y(R) = \int_R \ldots \int p(S) dv_S \qquad (1)$$

$$Q(R) = \int_{-\infty}^{0} \ldots \int\int_R \ldots \int p(s_C, S) ds_C dv_S. \qquad (2)$$

Bounding Box Based Chip Disposition:

As noted above, existing industry practices typically adopt a threshold value-based bounding box as the chip acceptance region. In other words, each surrogate metric is bounded by two upper and lower bound threshold values.

A straightforward approach is to use the N-sigma box, i.e., each surrogate metric $S_i$ is centered around its mean value $S_{i,0}$, and its lower and upper bounds are determined by its lower and upper N-sigma values. Thus the acceptance region R is defined by R={$S_i \in [S_{i,0} \pm N \cdot \sigma_i]$, $\forall i=1, \ldots, n$}.

An improved approach is to relax the bounding box so that the lower and upper bounds are not necessarily centered around each surrogate metric's mean value. In other words, the acceptance region R is defined by R={$S_i \in [S_{i,min}, S_{i,max}]$ $\forall i=1, \ldots, n$}. To find the "optimal" bounding box for a given PQL constraint $\overline{Q}$, solve the following optimization problem:

$$\max_{\forall S_{i,min}, S_{i,max}} Y \text{ s.t. } Q \leq \overline{Q}. \qquad (3)$$

Solving (3) typically requires a few optimization iterations, and each iteration involves evaluation of Y and Q, which has, however, high computational cost because of the high-dimensional integration as shown in (1) and (2). Furthermore, the complexity is directly related to the number of testing surrogate metrics n, which is undesirable as higher n is typically required for better testing quality.

Even if the "optimal" solution to (3) can be found, such a solution is still sub-optimal because it restricts the choice of acceptance regions to be a box rather than any possible shape. Immediately below, techniques will be presented which permit a true optimal acceptance region to be derived.

Optimal Chip Disposition:

To simplify the derivation, define probability density of yield y(S) and probability density of PQL q(S) in the surrogate metric space S as follows:

$$y(S) = p(S) \qquad (4)$$

$$q(S) = p(S) \int_{-\infty}^{0} \ldots \int p(s_C | S) ds_C \qquad (5)$$

Through the identity of $p(s_C, S) = p(s_C|S)p(S)$, substitute (4) and (5) into (1) and (2), respectively, and obtain the following equations to compute Y(R) and Q(R):

$$Y(R) = \int_R \ldots \int y(S) dv_S \qquad (6)$$

$$Q(R) = \int_R \ldots \int q(S) dv_S \qquad (7)$$

When a region with volume $dv_S$ is sufficiently small, both the yield density and PQL density inside the region can be considered as constant. Hence, express the yield and PQL of this region as $dY = y dv_S$ and $dQ = q dv_S$, respectively. Note the following properties:

Property 1:

If acceptance regions $R_1$, $R_2$ and $R_3$ are such that $R_1 \cap R_2 = \emptyset$ and $R_3 = R_1 \cap R_2$, then the yield and PQL of $R_3$ are sums of the yields and PQLs of regions $R_1$ and $R_2$, i.e. $Y(R_3) = Y(R_1) + Y(R_2)$ and $Q(R_3) = Q(R_1) + Q(R_2)$. In other words, both the yield and PQL are additive functions of the acceptance regions.

Property 2:

If acceptance regions $R_1$ and $R_2$ are such that $R_1 \subset R_2$, then their yield and PQL satisfy inequalities $Y(R_1) \leq Y(R_2)$ and $Q(R_1) \leq Q(R_2)$. In other words, both the yield and PQL are monotone increasing functions of the acceptance regions.

Introduce a concept called disposition density, which is defined as the ratio between probability density of PQL and probability density of yield, i.e., $$g(S) = \frac{q(S)}{y(S)} = \int_{-\infty}^{0} \ldots \int p(s_C | S) ds_C \qquad (8)$$

With this concept, the following theorem is proven, which assists in finding the optimal acceptance region.

Theorem 1:

An acceptance region R is optimal if and only if the disposition density d satisfies the following inequality $g(a) \leq g(b)$ for any point $a \in R$ and any other point $b \notin R$.

Proof:

For brevity, do not consider the pathological cases with PDFs having singular points or regions with points having empty neighborhood, or disposition density not achieving its maximum in an acceptance region. These and other pathological cases could be considered with careful analysis of topological properties of the variational space and its Lebesque measures for random variables. If the region is the whole variational space, the theorem is clear. Therefore, only consider the case when the optimal acceptance region is not the whole variational space.

First, prove through contradiction the necessity of the optimality condition. Suppose that the optimality condition is not satisfied. Then there are two points $a \in R$ and $b \notin R$ such that their densities satisfy the inequality $g(a) > g(b)$. Select small neighborhoods of these points $dR_a \subset R$ and $dR_b \subset \overline{R}$ as it is shown at plot (a) in FIG. 2. These regions $dR_a$ and $dR_b$ are sufficiently small so that the yield and PQL densities are considered constant inside them. Additionally, require that both regions have the same PQL dQ. All these conditions can be easily satisfied by properly sizing the two selected regions. Denote the volumes of the regions $dR_a$ and $dR_b$ as $dv_a$ and $dv_b$. Then PQL dQ and yields $dY_a$ and $dY_b$ are expressed as follows:

$$dQ = q(a)dv_a = q(b)dv_b \qquad (9)$$
$$dY_a = y(a)dv_a = \frac{y(a)dQ}{q(a)} = \frac{dQ}{g(a)}$$
$$dY_b = y(b)dv_b = \frac{y(b)dQ}{q(b)} = \frac{dQ}{g(b)}$$

From these equations, note that $dY_b > dY_a$ while the PQL is same for both regions. Therefore, the region $R_1 = (R \setminus dR_a) \cup dR_b$ has the same PQL as the region R but larger yield than R. This contradicts the statement that the region R is optimal. The contradiction proves the necessity part of this theorem.

Now, prove the sufficiency of the optimality condition. Suppose there is a region $R_1$ that satisfies the optimality condition but is not optimal. Then there must exist another region $R_2$ with the same PQL $Q(R_2)=Q(R_1)=Q$ but with higher yield $Y(R_2) > Y(R_1)$.

By excluding the common region from both regions, construct two new regions: $R'_1 = R_1 \setminus (R_1 \cap R_2)$ and $R'_2 = R_2 \setminus (R_1 \cap R_2)$, as shown at plot (b) in FIG. 2. It is clear that $R'_1$ and $R'_2$ have the same PQL $Q(R'_2) = Q(R'_1) = Q'$ and their yields satisfy the inequality $Y(R'_2) > (R'_1)$.

Figure 2:
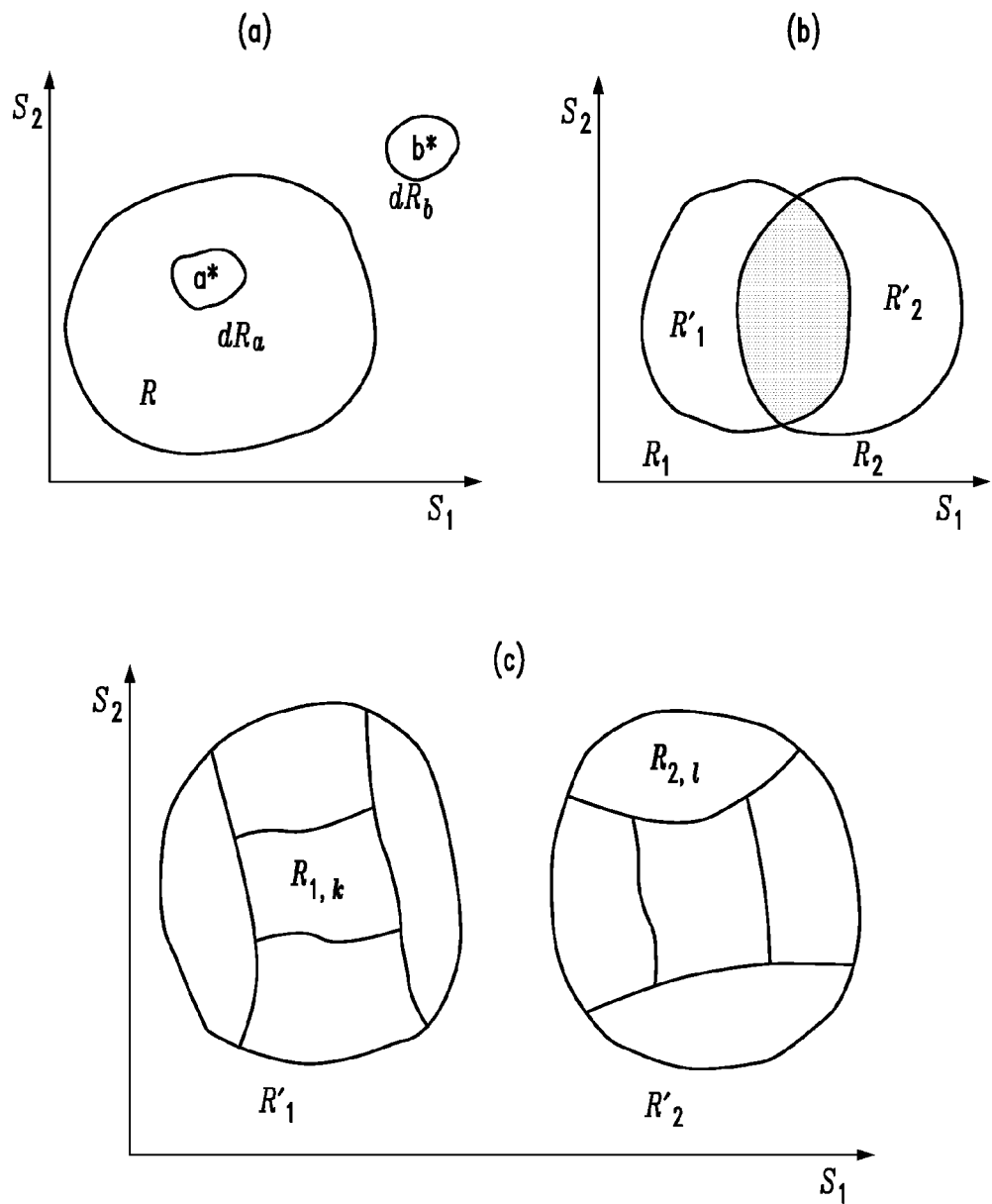
FIG. 2 illustrates a proof of a theorem regarding an optimal disposition region.

Then subdivide the regions $R'_1$ and $R'_2$ into the same N number of sufficiently small sub-regions $R_{1,i} \subset R'_1$ and $R_{2,i} \subset R'_2$ with equal PQL $Q(R_{1,i}) = Q(R_{2,j}) = \Delta Q = \overline{Q/N}$ as shown at plot (c) in FIG. 2. From these regions, select sub-regions $R_{1,k} \subset R'_1 \subset R_1$ and $R_{2,l} \subset R'_2 \subset \overline{R}_1$ with the same PQL $\Delta Q$ but with the yields satisfying the inequality $Y(R_{2,l}) > Y(R_{1,k})$. Then, by writing equations similar to (9), show that the disposition densities for these regions can be expressed as:

$$q_1 = \frac{\Delta Q}{Y(R_{1,k})} \text{ and } q_2 = \frac{\Delta Q}{Y(R_{2,l})}.$$

From these equations, note that $q_1 > q_2$. Because $q_1$ is the disposition density of the point belonging to $R_1$ and $q_2$ is the disposition density of the point belonging to $R'_2$ that is outside $R_1$, this contradicts the assumption that $R_1$ satisfies the optimality condition. This contradiction proves the sufficiency part of the theorem.

This completes the proof of this theorem.

From Theorem 1, it is possible to prove a statement that is stated as a theorem in the following.

Theorem 2:

The optimal acceptance region R is defined by the inequality $g(R) \leq \delta$ with parameter $\delta$ determined by the required PQL value $\overline{Q}$ through (2). The boundary of this region is defined by the equation $g(R) = \delta$.

In other words, the optimal acceptance region can be parameterized by $\delta$ with different PQL values corresponding to different $\delta$. Hence $\delta$ is referred to as a disposition parameter.

Theorem 2 is significant because it prescribes a systematical approach to find the optimal acceptance region, thus solving for the optimal chip disposition criterion.

Technique 1: Optimal Chip Disposition Criterion
Input: $s_C$, S, $p(s_C)$, $p(s_C, S)$, and $\overline{Q}$
1. Compute $\delta$ by solving $$\overline{Q} = \int_{-\infty}^{0} \cdots \int ds_C \int_{g(S) \leq \delta} \cdots \int p(s_C, s) dv_S$$

2. Compute optimal yield $$Y = \int_{g(S) \leq \delta} \cdots \int p(S) dv_S$$

3. Return optimal chip disposition criterion as $g(S) \leq \delta$.

In other words, for any chip with its measured surrogate testing slacks S, check whether the inequality $g(S) \leq \delta$ holds. If it does, the chip is accepted; otherwise, it is discarded.

Note that Technique 1 is general in the sense that it applies to any JPDF, and it does not restrict how those chip target metrics and surrogate metrics are obtained.

The complexity and difficulty in applying Technique 1 for a particular application, however, depends on how to solve for $\delta$, which involves multi-dimensional integration with high computational cost. In at least some exemplary instances, use chip timing slacks based on multivariate Gaussian distributions to show how $\delta$ can be solved efficiently in an elegant way, thus finding the optimal chip disposition criterion.

Assume the JPDF between the chip slacks $s_C$ and testing path slacks S follows a multivariate Gaussian distribution, which can be obtained through either statistical timing analysis or manufacturing measurements. The mean values of $s_C$ and S are denoted as $\mu_c$ and $\mu_s$, and the variance matrices of $s_C$ and S as $\Sigma_c$ and $\Sigma_S$, respectively; and the covariance between them as $\Sigma$.

Since the derivation to be discussed in this section relies on the conditional probability of a multivariate Gaussian distribution, it is reviewed briefly herein. Assume X is a random variable vector that follows a multivariate Gaussian distribution. Denote its JPDF as $N(X, \mu, \Sigma)$ with its mean vector $\mu$ and covariance matrix $\Sigma$. Partition X into two parts as $X_a$ and $X_b$ as shown below:

$$X = \begin{pmatrix} X_a \\ X_b \end{pmatrix} \qquad (10)$$

$$\mu = \begin{pmatrix} \mu_a \\ \mu_b \end{pmatrix}$$

$$\Sigma = \begin{pmatrix} \Sigma_a & \Sigma_{a,b} \\ \Sigma_{a,b}^T & \Sigma_b \end{pmatrix}$$

Then the probability of $X_a$ conditional upon $X_b$ is another multivariate Gaussian distribution with its JPDF denoted as:

$$p(X_a | X_b) = N(X_a, \hat{\mu}_a, \hat{\Sigma}_a),$$

where $$\hat{\mu}_a = \mu_a + \Sigma_{a,b} \Sigma_b^{-1} (X_b - \mu_b) \qquad (11)$$

$$\hat{\Sigma}_a = \Sigma_a - \Sigma_{a,b} \Sigma_b^{-1} \Sigma_c^T \qquad (12)$$

For this new conditional distribution $p(X_a|X_b)$, note that only its mean vector $\hat{\mu}_a$ in (11) depends on the conditional value $X_b$, but not its covariance matrix $\hat{\Sigma}_a$ in (12). Therefore, further simplify the notation of (11) as $$\hat{\mu}_a = \Sigma_{a,b}\Sigma_b^{-1}X_b + \mu_a - \Sigma_{a,b}\Sigma_b^{-1}\mu_b = \alpha X_b + \beta \quad (13)$$

with $$\alpha = \Sigma_{a,b}\Sigma_b^{-1} \text{ and } \beta = \mu_a - \Sigma_{a,b}\Sigma_b^{-1}\mu_b.$$

In other words, the conditional mean vector $\hat{\mu}_a$ depends on $X_b$ linearly.

A. Optimal Disposition for Combined Single Chip Slack:

In this section, there is a combined single target chip slack $s_C$. In other words, a good chip should have its chip slack to be positive.

Since $s_C$ is a scalar, $\Sigma_c = \sigma_c^2$ and the covariance between $s_C$ and S is a 1×n covariance vector, i.e., $\Sigma_{c,S} = \gamma$. The probability of $s_C$ conditional upon any measurements of testing path slacks S is given by $p(s_C|S)$, which is a univariate Gaussian distribution. Following (13) and (12), its mean and variance are given by $$\hat{\mu}_c = \mu_c + \gamma\Sigma_S^{-1}(S-\mu_S) = \alpha_1 \cdot S + \beta_1, \quad (14)$$

$$\hat{\sigma}_c^2 = \sigma_c^2 - \gamma\Sigma_S^{-1}\gamma^T, \quad (15)$$

where $$\alpha_1 = \gamma\Sigma_S^{-1} \text{ and } \beta_1 = \mu_c - \gamma\Sigma_S^{-1}\mu_S.$$

The disposition density function is given by:

$$g(S) = \int_{-\infty}^{0} p(s_C | S)ds_C = \Phi\left(-\frac{\hat{\mu}_c}{\hat{\sigma}_c}\right), \quad (16)$$

where $\Phi(\bullet)$ is the cumulative density function (CDF) of a normalized Gaussian distribution.

Since the CDF $\Phi(\bullet)$ is a monotone increasing function, $$g(S) \leq \delta \Leftrightarrow \alpha_1 S \geq c, \quad (17)$$

with c given by $$c = -\beta_1 - \hat{\sigma}_c \Phi^{-1}(\delta), \quad (18)$$

where $\Phi^{-1}(\bullet)$ is the inverse function of $\Phi(\bullet)$. In other words, there is a one-to-one correspondence between $\delta$ and c. Therefore, in the same manner as $\delta$, also refer to c as the disposition parameter. To compute c, one or more embodiments require $Q(R)$ to be $\overline{Q}$ as follows:

$$\overline{Q} = \int_{-\infty}^{0} \int_{g(S) \leq \delta} \cdots \int p(s_C, S)ds_C dv_S =$$

$$\int_{-\infty}^{0} \int_{\alpha_1 S \geq c} \cdots \int p(S | s_C)p(s_C)ds_C dv_S =$$

$$\int_{-\infty}^{0} p(s_C)ds_C \int_{\alpha_1 S \geq c} \cdots \int p(S | s_C)dv_S$$

where $p(S|s_C)$ is the JPDF of the conditional S upon $s_C$. The latter is denoted as $\tilde{S}$ and follows a multivariate Gaussian distribution. The mean $\mu_t$ and variance $\Sigma_t$ of $\tilde{S}$ are obtained analytically in terms of $s_C$ by following (13) and (12). The n-dimensional integral of $p(S|s_C)$ is related to the CDF of $\tilde{S}$, for which, there is no closed formula in general. But note that the limits of this integral are a linear function of this conditional $\tilde{S}$. Therefore, construct a univariate Gaussian $x = \alpha_1 \tilde{S}$ with its mean $\mu_x = \alpha_1 \mu_t$ and variance $\sigma_x^2 = \alpha_1 \Sigma_t \alpha_1^T$. Hence:

$$\overline{Q} = \int_{-\infty}^{0} p(s_C)P(x \geq c)ds_C \quad (19)$$

$$= \int_{-\infty}^{0} p(s_C)\Phi\left(\frac{\mu_x - c}{\sigma_x}\right)ds_C. \quad (20)$$

The simplification of Q from (2) to (20) is significant, because the n+1 dimensional integration problem of (2) has been reduced to a one-dimensional integration problem of (20), thus improving computational efficiency greatly.

Following the procedures as shown in Technique 1, in step 1, solve (20) numerically to obtain the corresponding disposition parameter c. This can be done easily as it is a simple one-dimension root finding problem. Having obtained c, plug it into (18) to obtain the $\delta$. The optimal yield and chip disposition criterion are obtained from steps 2 and 3 of the technique. Alternatively, $\alpha_1 S \geq c$ can also be used as the optimal chip disposition criterion as shown in (18).

B. Optimal Disposition for Separate Setup and Hold Slacks:

Consider two target chip slacks determined by setup and hold tests separately. This separation is generally more convenient than using one single combined chip slack for chip designs. In other words, a good chip should have both its setup slacks and its hold slacks to be positive.

For clarify of presentation, denote the setup chip slack and hold chip slack separately as $s_s$ and $s_h$. Then the disposition density function as shown in (8) is given by:

$$g(S) = \int_{-\infty}^{0}\int_{-\infty}^{0} p(s_s, s_h | S)ds_s ds_h, \quad (21)$$

where $p(s_s, s_h|S)$ is the JPDF of $s_s$ and $s_h$ conditional upon the testing path slack S, which is a bivariate Gaussian distribution, i.e., $N(s_s, s_h, \hat{\mu}, \hat{\Sigma})$. Obtain $\hat{\mu}$ and $\hat{\Sigma}$ in terms of S analytically by following (13) and (12). Moreover, as in (13), denote the conditional mean vector $\hat{\mu}$ as:

$$\hat{\mu} = \begin{pmatrix} \hat{\mu}_s \\ \hat{\mu}_h \end{pmatrix} = \alpha_2 S + \beta_2. \quad (22)$$

By defining $\hat{s}_s = s_s - \hat{\mu}_s$ and $\hat{s}_h = s_h - \hat{\mu}_h$, and through change-of-variable, (21) can be written as:

$$g(S) = \int_{-\infty}^{-\hat{\mu}_s}\int_{-\infty}^{-\hat{\mu}_h} N\left(\hat{s}_s, \hat{s}_h, 0, \hat{\Sigma}\right)d\hat{s}_s d\hat{s}_h \quad (23)$$

From (23), note that the dependency of g(S) on S purely comes from the dependency of $\hat{\mu}_s$ and $\hat{\mu}_h$ on S as shown in (22). Hence the optimal disposition criterion can be written as:

$$g(S) = g(\hat{\mu}_s, \hat{\mu}_h) = g(\alpha_2 S + \beta_2) \leq \delta. \quad (24)$$

To find the optimal δ, require $Q(R) = \overline{Q}$, i.e., $$\overline{Q} = \int_{-\infty}^{0}\int_{-\infty}^{0}\int \ldots \int_{g(S)\leq\delta} p(s_s, s_h \cdot S)ds_s ds_h dv_S =$$

$$\int_{-\infty}^{0}\int_{-\infty}^{0}\int \ldots \int_{g(\alpha_2 S+\beta_2)\leq\delta} p(S \mid s_s, s_h)p(s_s \cdot s_h)ds_s ds_h dv_S =$$

$$\int_{-\infty}^{0}\int_{-\infty}^{0} p(s_s, s_h)ds_s ds_h \int \ldots \int_{g(\alpha_2 S+\beta_2)\leq\delta} p(S \mid s_s, s_h)dv_S$$

where $p(S|s_s, s_h)$ is the JPDF of the conditional S upon both $s_s$ and $s_h$. The latter is denoted as $\tilde{S}$ and follows a multivariate Gaussian distribution. The mean $\mu_t$ and variance $\Sigma_t$ of $\tilde{S}$ are obtained analytically in terms of $s_s$ and $s_h$ by following (13) and (12). The n-dimensional integral above is related to the CDF of $\tilde{S}$, for which there is no closed formula in general. However, here the limits of this integral are related to two linear functions of this conditional $\tilde{S}$. Therefore, construct a bivariate Gaussian as follows:

$$\begin{pmatrix} x_1 \\ x_2 \end{pmatrix} = \alpha_2 \tilde{S} + \beta_2, \quad (25)$$

and its mean $\mu_x = \alpha_2 \mu_t + \beta_2$ and variance $\Sigma_x = \alpha_2 \Sigma_t \alpha_2^T$. Then the n-dimensional integral can be simplified as a 2-dimensional integral as:

$$\int \ldots \int_{g(\alpha_2 S+\beta_2)\leq\delta} p(S \mid s_s, s_h)dv_S = \int\int_{g(x_1, x_2)\leq\delta} N\left(x_1, x_2, \mu_x, \sum_x\right)dx_1 dx_2.$$

Then, the PQL can be rewritten as:

$$\overline{Q} = \int_{-\infty}^{0}\int_{-\infty}^{0} p(s_s, s_h) \int\int_{g(x_1, x_2)\leq\delta} N\left(x_1, x_2, \mu_x, \sum_x\right)dx_1 dx_2 ds_s ds_h. \quad (26)$$

The simplification of Q from (2) to (26) is significant, because the n+2 dimensional integration problem of (2) has been reduced to the 4-dimensional integration problem of (26), thus improving computational efficiency greatly.

Following the procedures as shown in Technique 1, in step 1, solve (26) numerically to obtain the corresponding disposition parameter δ. This can be done easily as it is a four-dimension root finding problem. Having obtained δ, the optimal yield and chip disposition criterion are obtained from steps 2 and 3 of the technique.

Experimental Results

Non-limiting exemplary experimental results are presented purely for purposes of demonstrating what can be achieved in one or more embodiments of the invention. Other embodiments might achieve different results. Presentation of exemplary experimental results is not intended to be construed as limiting claim scope or equivalents. Technique 1 as discussed above for chip timing testing was implemented in Matlab® software (registered mark of The Mathworks Inc., 3 Apple Hill Drive, Natick Mass., USA) for experimental purposes. Use of Matlab® software is a non-limiting approach adopted for experimental purposes. The JPDF between the target chip slacks and the surrogate testing slacks were obtained through statistical timing analysis, where slacks are represented as a linear function of process parameters that follow a Gaussian distribution. The number of process parameters and amount of variations were determined by the foundry data based on 45 nm technology. Five illustrative and non-limiting surrogate testing slacks were chosen for the experiments; however, it should be understood that the proposed techniques are not limited to this particular setting.

In the first set of experiments, there is one combined target chip slack. In other words, a good chip should have this chip setup slack to be positive.

Figure 3:
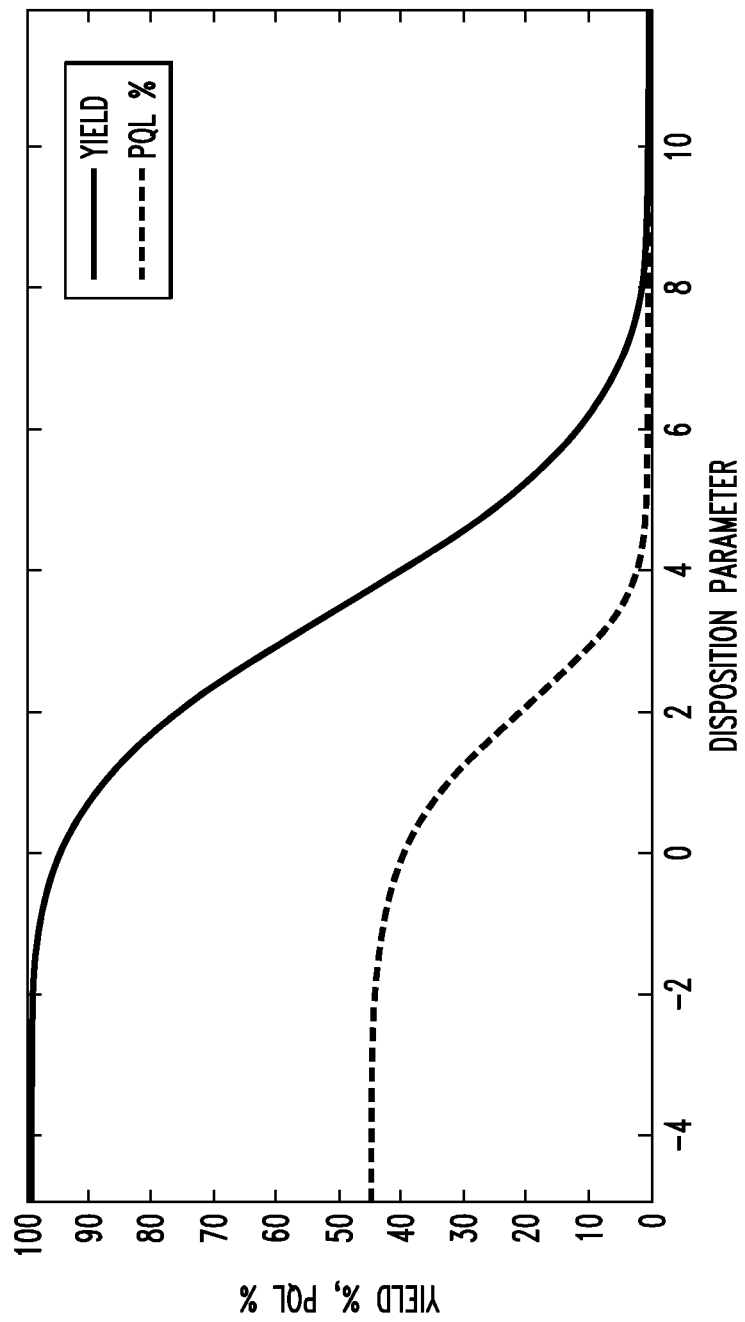
FIG. 3 plots optimal yield and PQL as functions of the disposition parameter.
Figure 4:
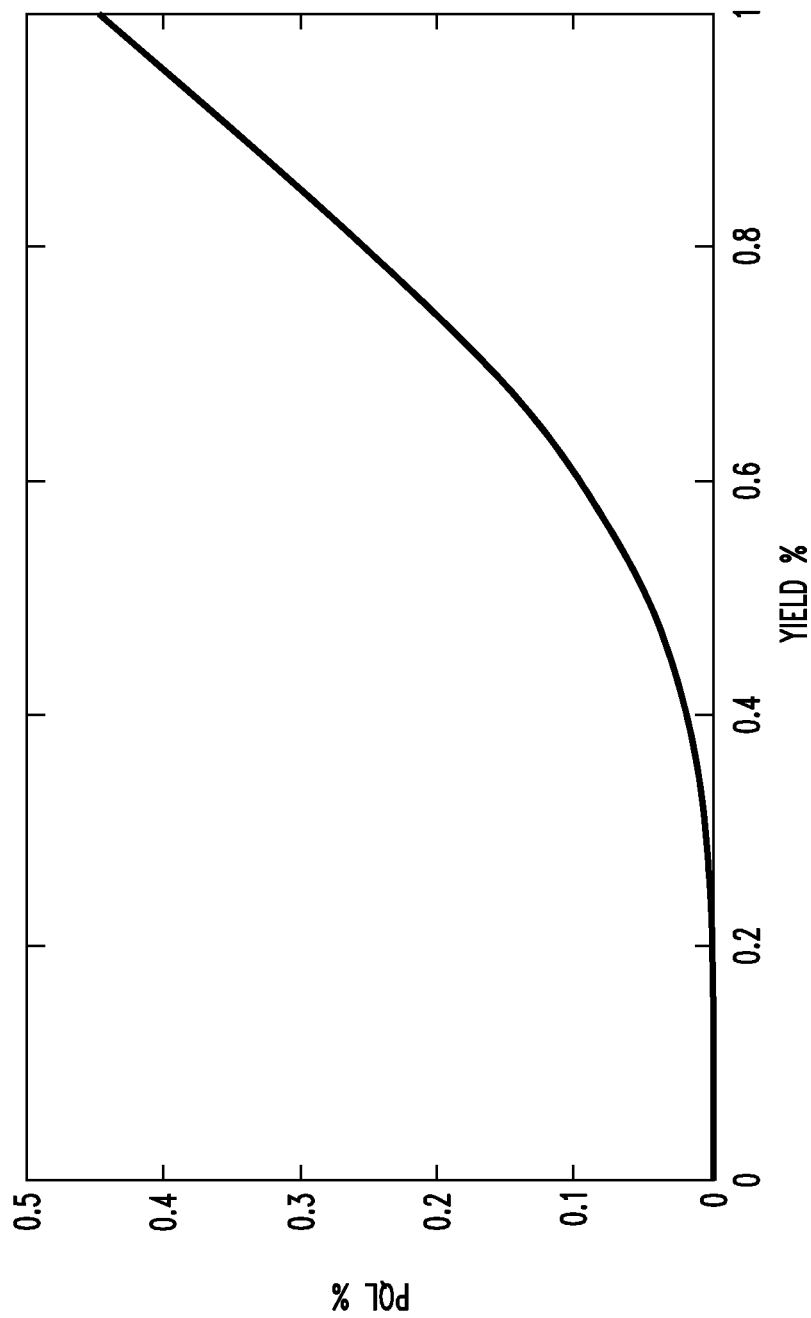
FIG. 4 plots PQL as a function of the optimal yield.

FIG. 3 plots the relationship between PQL value Q and optimal disposition parameter c, along with the corresponding optimal yield Y. As the requirement on PQL becomes more strict (i.e., having smaller Q), the optimal disposition parameter c becomes larger, and the corresponding optimal yield is less. All the results are expected according to (17), which shows that the optimal acceptance region is a half-space with the slope $\alpha_1 = -\gamma \Sigma_s^{-1}$ being positive. In other words, the larger the value of c, the smaller the half-plane acceptance region, thus the smaller PQL and yield. FIG. 4 plots the tradeoff between PQL and yield, where it can be seen that the more strict the requirements on PQL, the less the optimal yield.

Figure 5:
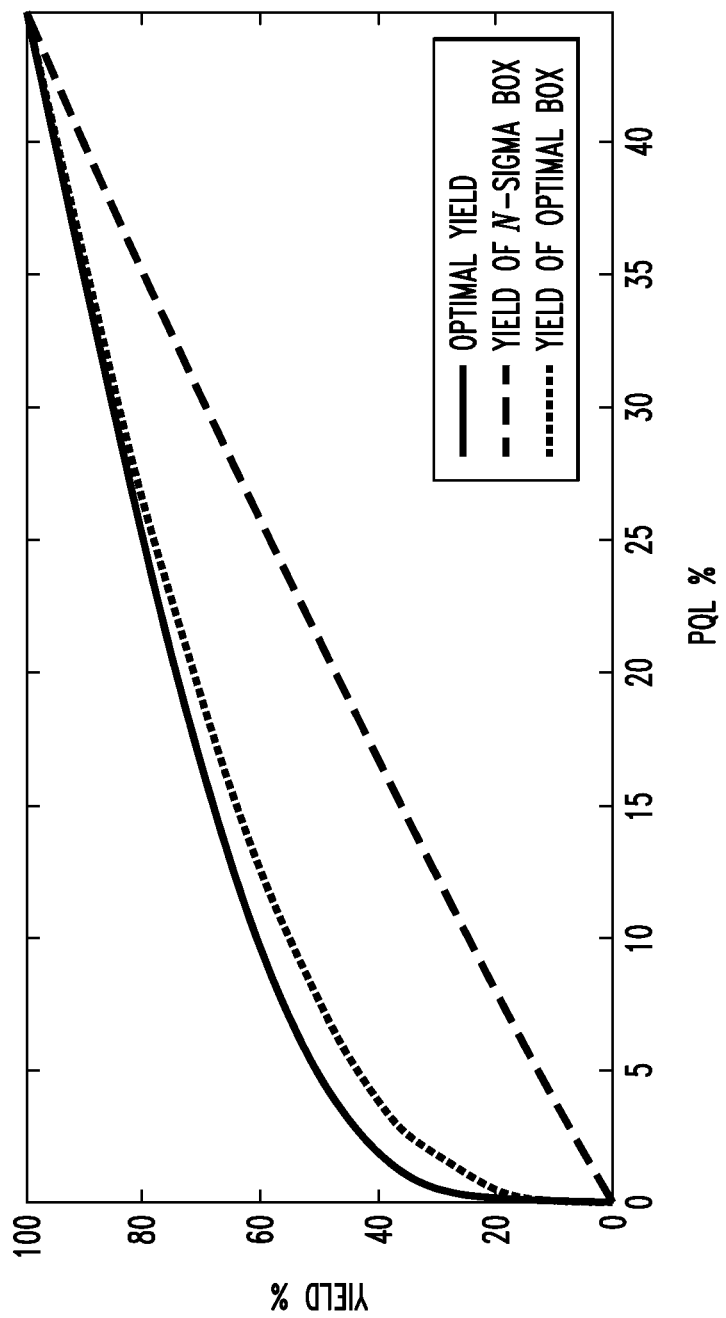
FIG. 5 plots yield as a function of PQL for different disposition criteria.

The approach of one or more embodiments is next compared with the other two approaches as discussed above: the N-sigma box approach and the "optimal" box approach, respectively. For the N-sigma box approach, sweep parameter N to find the N-sigma box that meets the required PQL Q with maximum yield. For the optimal box approach, solve (3) to obtain the optimal box region. Because of the high computational cost in solving (3), for fair comparison, limit the number of surrogate metrics to be two in this experiment. As discussed above, both box approaches are sub-optimal because of the restriction on the choice of acceptance regions to be a box rather than any possible shapes. The best yields achievable from these three methods are compared under the same PQL constraints in FIG. 5. It can be seen that the optimal yield method in accordance with one or more embodiments of the invention always gives the highest yield among the three, while the optimal box ranks the second and the N-sigma box is the worst. Furthermore, this trend holds across all PQL values as shown in FIG. 5, and the improved yield gain from the approach of one or more embodiments is more significant when PQL is small, which is typically the case in reality.

Figures 6, 7:
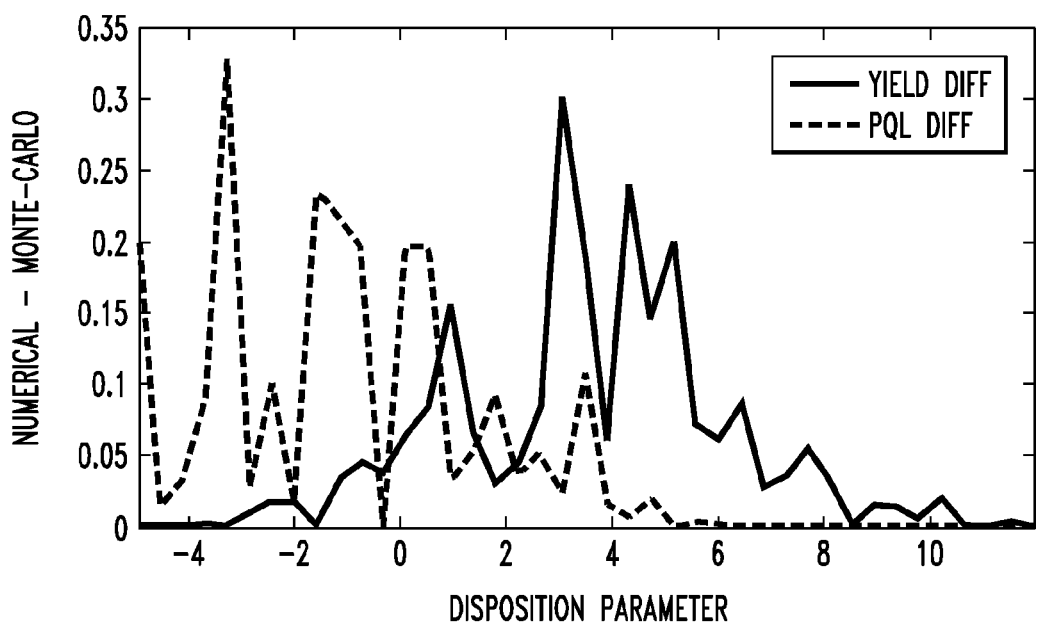
FIG. 6 presents Table I, yield in percentage comparison under the same PQL constraints as $PQL <= \overline{Q} = 1\%$.
FIG. 7 plots the difference between numerical and MC computation of yield and PQL.

Table I, presented in FIG. 6, shows the yield comparison among the three approaches under the same PQL constraint, i.e., $\overline{Q}=1\%$. Note that the optimal box criterion achieves better yield than the N-sigma box, and the relative improvement ranges from 37.0% to 825%. The best solution is the true optimal one in accordance with one or more embodiments, and the relative improvement over the N-sigma box ranges from 38.3% to 1234%. According to Table I, it can be seen that the optimal box approach has yielded only a few percentage less than the true optimal one. However, it should be noted that the optimal box approach is not scalable to more surrogate testing metrics. In contrast, the complexity of the optimal solution as discussed elsewhere herein is almost independent of the number of surrogate testing metrics. Therefore, the most desirable solution is still believed to be the last one.

As noted above, the dual formulation is also valid that minimizes the PQL under a given yield constraint $\overline{Y}$. Such PQL comparison among the three approaches under the same yield constraint is shown in Table II presented in FIG. 8. Note that the least achievable PQL is from the true optimal solution, and the relative improvement over the N-sigma box approach ranges from 16% to 86%. The improvement is more significant when the yield constraint is less, which is expected as it leaves more design freedom for optimization. The next winner is the optimal box approach, whose achievable PQL values are consistently less than the N-sigma box approach. The relative improvement ranges from 13% to 79%.

A Monte-Carlo simulation was also run to verify the correctness of the computation for both yield and PQL as a function of disposition parameter. For a given disposition parameter c, a half plane defines the optimal acceptance region in the five-dimensional surrogate metric space S according to (17). The yield and PQL in this region were computed through both the numerical approach in accordance with one or more embodiments and the Monte Carlo approach, and the differences were computed. The results are shown in FIG. 7, and it can be seen that the computation in accordance with one or more embodiments is accurate with less than 0.5% error compared to the "golden" Monte Carlo simulation.

A second set of experiments changed the target chip slacks to two separate chip slacks determined by, respectively, setup and hold tests in the design. In other words, a good chip should have its setup slack and hold slack both to be positive.

Figures 8, 9:
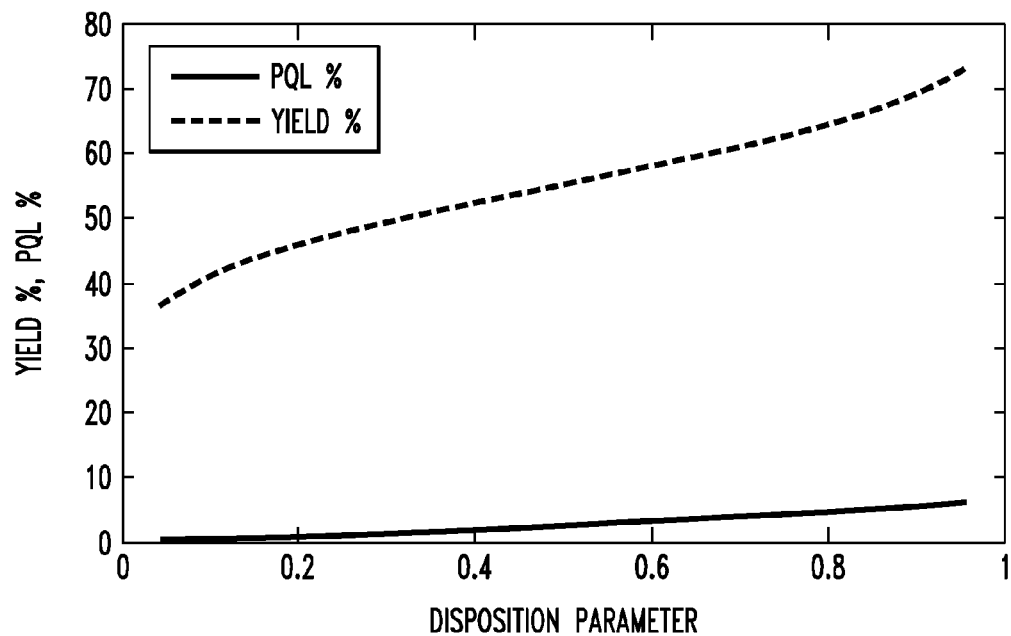
FIG. 8 presents Table II, PQL in percentage comparison with yield constraints.
FIG. 9 plots optimal yield and PQL for two slack metrics.
Figure 10:
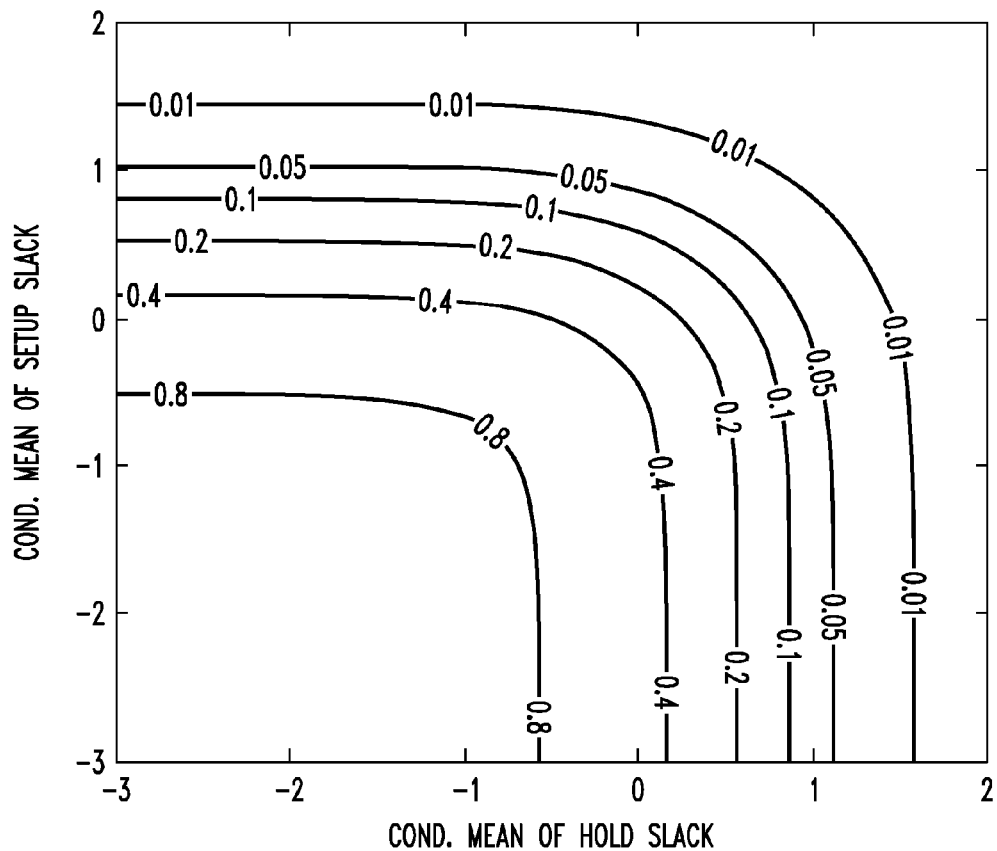
FIG. 10 plots optimal disposition regions for two slack metrics.

The relationship between PQL value Q and optimal disposition parameter δ is plotted in FIG. 9 along with the corresponding optimal yield Y. As can be seen, as the requirement on PQL becomes more strict (i.e., having smaller Q), the optimal disposition parameter δ becomes smaller, and the corresponding optimal yield is less. All the results are again explainable through (24), which defines the optimal acceptance region. Note that above, the acceptance region is defined in the surrogate metric space S, but graphically illustrating that region in multiple dimensions is difficult. Therefore, instead of drawing such region in a five-dimensional space, plot the region in two dimensions through the two transformed variables $\hat{\mu}_s$ and $\hat{\mu}_h$, which are linear functions of those surrogate metrics as shown in (24). Plot the acceptance region in the space of $\hat{\mu}_s$ and $\hat{\mu}_h$ in FIG. 10, parameterized by different optimal disposition parameters δ. The acceptance region is the upper right region of each curve. It is clear that when PQL becomes more strict, the disposition parameter δ also becomes smaller, which correspondingly defines a smaller acceptance region in FIG. 10. Note that the smaller the acceptance region, the smaller the yield and PQL.

Figure 11:
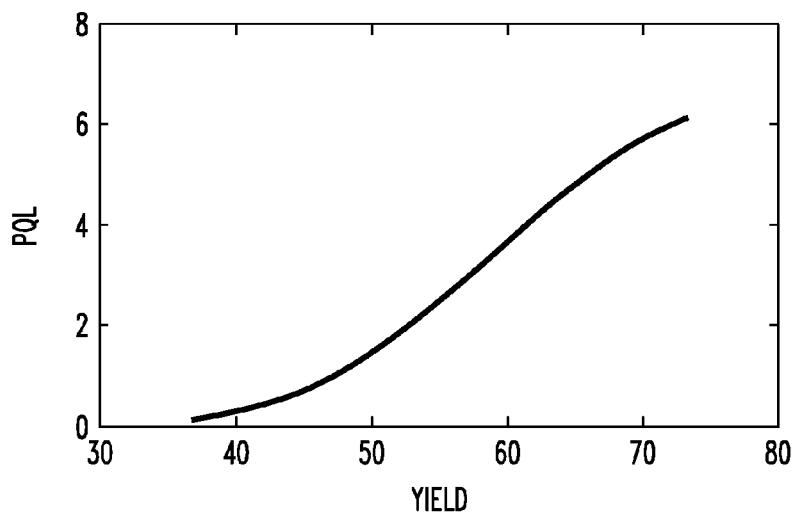
FIG. 11 plots PQL as a function of optimal yield for two slack metrics.

FIG. 11 plots the tradeoff between PQL and yield for this experiment. It can be seen that the same trend holds, i.e., the more strict the requirements on PQL, the less the optimal yield.

Recapitulation

The chip disposition criteria directly impact the fundamentals of any chip design: yield and PQL. One or more embodiments provide an elegant and mathematically rigorous method to systematically derive the optimal chip disposition criteria. The method employs a loose assumption on the relation between target chip metric and surrogate test metrics, i.e., that they follow a general JPDF that is readily obtainable through either foundry historical data or statistical analysis tools (such as timing).

One or more embodiments are applicable to chip performance testing, and permit analytically deriving an optimal chip disposition function for the target chip slacks based on a set of surrogate testing slacks. This derivation is based on multivariate Gaussian distribution, and numerical experimental results have convincingly shown that a method in accordance with one or more embodiments is both effective and accurate. Compared to the existing ad-hoc N-sigma box approach, the exemplary optimal chip disposition criteria can significantly improve the yield under the same PQL constraints.

Advantageously, in one or more embodiments, the yield can be greatly improved without re-spinning the design. All that is required is a better criterion to decide how to accept a chip.

Figure 12:
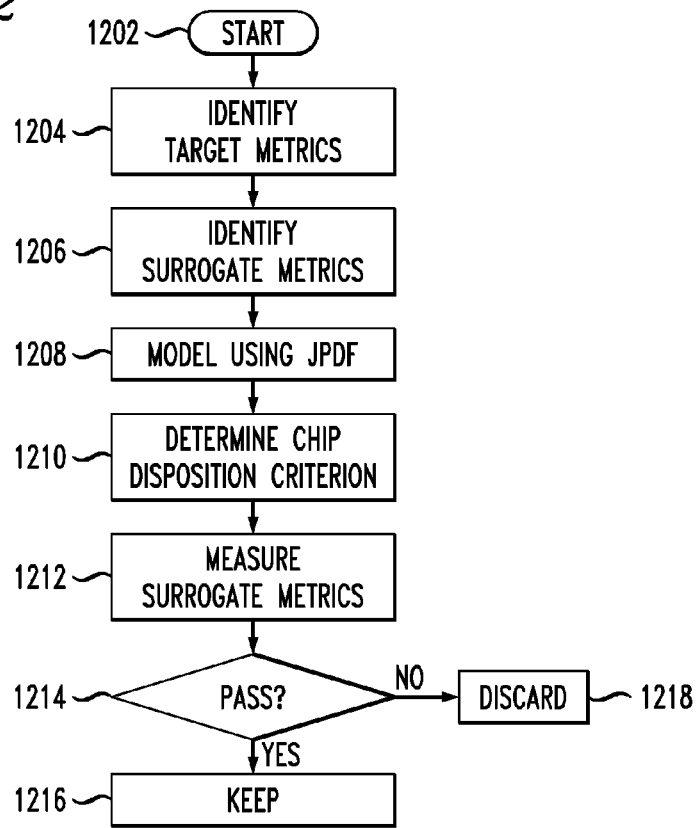
FIG. 12 is a flow chart of exemplary method steps, according to an aspect of the invention.

Reference should now be had to the flow chart of FIG. 12, which begins in step 1202. Given the discussion thus far, it will be appreciated that, in general terms, an exemplary method, according to an aspect of the invention, includes the step 1204 of identifying, for an integrated circuit chip design for which manufacturing chip testing is to be optimized, at least one target metric; as well as the step 1206 of identifying, for the integrated circuit chip design for which manufacturing chip testing is to be optimized, at least one surrogate metric. Note that, in a typical case, the target metric is timing only; however, even timing can be (1) combined setup and hold timing metric, or (2) separate setup timing metric and hold timing metric. Furthermore, while not required, in typical cases, there are often more than one surrogate metrics. Also included are the step 1208 of modeling a relationship between the at least one target metric and the at least one surrogate metric using a general joint probability density function (e.g., $p(s_C, S)$); and the step 1210 of determining a chip disposition criterion based on the general joint probability density function. The chip disposition criterion determines, for a given physical chip putatively manufactured in accordance with the design, based on the at least one surrogate metric for the given physical chip, whether the given physical chip is to be accepted or discarded during the manufacturing chip testing.

In at least some cases, in the determining step, the chip disposition criterion is an optimal chip disposition criterion to maximize chip yield given a product quality loss constraint, thereby obtaining an optimal yield.

In one or more embodiments, the at least one target metric is chip slack and the at least one surrogate metric is testing path slack.

In one or more instances, determining step 1210 includes determining a disposition parameter based on the product quality loss constraint, the chip slack, the testing path slack, the general joint probability density function (e.g., $p(s_C, S)$), a joint probability density function of the chip slack (e.g., $p(s_C)$), and a joint probability density function of the testing path slack (e.g., $p(S)$); for example, as described above in connection with step 1 of Technique 1. Furthermore, in one or more instances, determining step 1210 also includes computing the optimal yield based on the disposition parameter and the at least one surrogate metric; for example, as described above in connection with step 2 of Technique 1; and returning the optimal chip disposition criterion, based on the computing of the optimal yield, as a function of disposition density less than or equal to the disposition parameter; for example, as described above in connection with step 3 of Technique 1. Note that $p(s_C)$ and $p(S)$ can be derived from $p(s_c, S)$.

In some cases, the general joint probability density function is a multivariate Gaussian distribution. As discussed above, in some cases, the at least one target metric is a combined single target chip slack, while in some other cases, the target metrics include a first target chip slack based on a setup test and a second target chip slack based on a hold test.

In another approach, in some cases, in the determining step 1210, the chip disposition criterion comprises an optimal chip disposition criterion to minimize product quality loss given a chip yield constraint. Given the teachings herein, the skilled artisan will appreciate that this approach can be implemented, for example, by effectively "swapping" steps 1 and 2 in Technique 1 above.

Optional steps include measuring the surrogate metrics for the given physical chip, as at 1212; and accepting or discarding the given physical chip in accordance with the chip disposition criterion, as per decision block 1214 and steps 1216, 1218, respectively.

In some cases, the method further includes providing a system including distinct software modules, as discussed below in the exemplary system and article of manufacture details below.

Exemplary System and Article of Manufacture Details

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

One or more embodiments of the invention, or elements thereof, can be implemented in the form of an apparatus including a memory and at least one processor that is coupled to the memory and operative to perform exemplary method steps.

Figure 13:
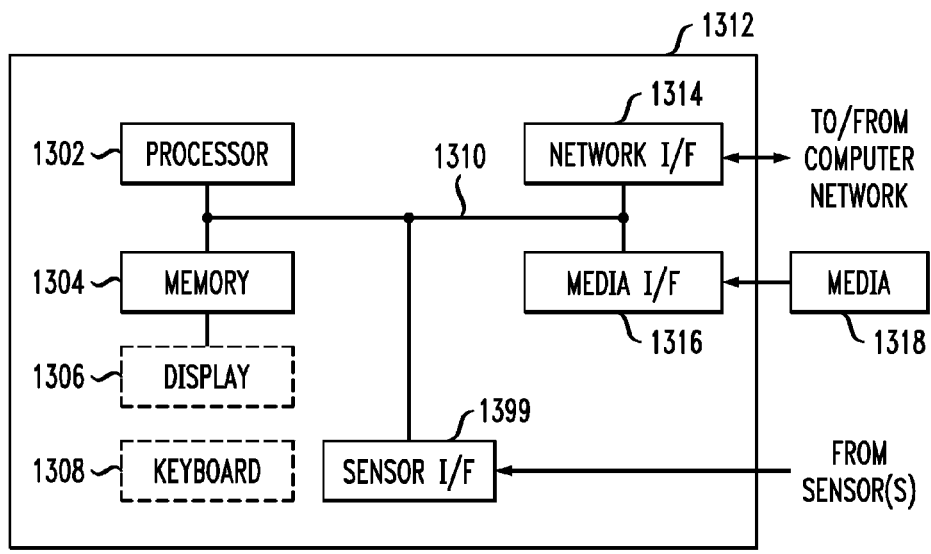
FIG. 13 depicts a computer system that may be useful in implementing one or more aspects and/or elements of the invention.

One or more embodiments can make use of software running on a general purpose computer or workstation. With reference to FIG. 13, such an implementation might employ, for example, a processor 1302, a memory 1304, and an input/output interface formed, for example, by a display 1306 and a keyboard 1308. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 1302, memory 1304, and input/output interface such as display 1306 and keyboard 1308 can be interconnected, for example, via bus 1310 as part of a data processing unit 1312. Suitable interconnections, for example via bus 1310, can also be provided to a network interface 1314, such as a network card, which can be provided to interface with a computer network, and to a media interface 1316, such as a diskette or CD-ROM drive, which can be provided to interface with media 1318.

Furthermore, a sensor interface 1399 can be coupled to bus 1310 to interface with one or more sensors; for example, to obtain the surrogate metrics during the chip testing process. Such sensor data could also be obtained in other ways, such as via the network interface 1314. The sensor interface could include an analog-to-digital converter where sensor data was in analog form.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 1302 coupled directly or indirectly to memory elements 1304 through a system bus 1310. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 1308, displays 1306, pointing devices, and the like) can be coupled to the system either directly (such as via bus 1310) or through intervening I/O controllers (omitted for clarity).

Network adapters such as network interface 1314 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 1312 as shown in FIG. 13) running a server program. It will be understood that such a physical server may or may not include a display and keyboard.

As noted, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Media block 1318 is a non-limiting example. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. Other non-limiting examples include Matlab® software, various statistical packages, FORTRAN, Tcl/Tk, various scripting languages, SMALLTALK, PERL, PYTHON, and the like. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a computer readable storage medium; the modules can include, for example, any or all of the elements depicted in the block diagrams and/or flow charts and/or described herein; by way of example and not limitation, a statistical analysis engine module, a data acquisition module, and an input/output module (for example, to signal whether a given chip is acceptable). Data acquisition can be, for example, via statistical pattern analysis, Monte Carlo simulation techniques, physical measurements, and the like. The method steps can then be carried out using the distinct software modules and/or sub-modules of the system, as described above, executing on one or more hardware processors 1302. Further, a computer program product can include a computer-readable storage medium with code adapted to be implemented to carry out one or more method steps described herein, including the provision of the system with the distinct software modules.

In a non-limiting example, identification of the target metric(s) and surrogate metric(s) can involve specification by a human expert; in some instances, aided by suitable computer aided design (CAD) tools or the like. Furthermore, in a non-limiting example, step 1208 can be carried out using statistical timing analysis, physical measurements, or the like; for example, aided by the aforementioned statistical analysis engine module. In addition, in a non-limiting example, step 1210 is carried out by the aforementioned statistical analysis engine module; for example, programmed to implement the above-described steps of Technique 1. Note that in some cases, as discussed above, the JPDF between the chip slacks $s_C$ and testing path slacks $S$ can be assumed to follow a multivariate Gaussian distribution, which can be obtained through either statistical timing analysis or manufacturing measurements; in such case, the programmed steps can be simplified as described above in the discussion regarding Optimal disposition for combined single chip slack and/or Optimal disposition for separate setup and hold slacks. In one or more instances, the aforementioned data acquisition module can be employed to measure the surrogate metrics for the given physical chip; and the aforementioned input/output module can facilitate outputting a signal to indicate whether the given physical chip is to be accepted or discarded.

In any case, it should be understood that the components illustrated herein may be implemented in various forms of hardware, software, or combinations thereof; for example, application specific integrated circuit(s) (ASICS), functional circuitry, one or more appropriately programmed general purpose digital computers with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
   identifying, for an integrated circuit chip design for which manufacturing chip testing is to be optimized, at least one target metric;
   identifying, for said integrated circuit chip design for which manufacturing chip testing is to be optimized, n surrogate metrics in an n-dimensional surrogate metric space, n being at least two;
   modeling a relationship between said at least one target metric and said n surrogate metrics using a general joint probability density function;
   determining a chip disposition criterion based on said general joint probability density function, said chip disposition criterion comprising an acceptance region in said n-dimensional surrogate metric space which is unbounded by fixed threshold values and which determines, for a given physical chip putatively manufactured in accordance with said design, based on said n surrogate metrics for said given physical chip, whether said given physical chip is to be accepted or discarded during said manufacturing chip testing; and
   providing a system, wherein the system comprises at least one distinct software module, embodied in a non-transitory computer-readable storage medium, and wherein the distinct software module comprises a statistical analysis engine module;
   wherein said determining of said chip disposition criterion is carried out by said statistical analysis engine module executing on at least one hardware processor of a computer.

2. The method of claim 1, wherein, in said determining step, said chip disposition criterion comprises an optimal chip disposition criterion to maximize chip yield given a product quality loss constraint, thereby obtaining an optimal yield.

3. The method of claim 2, wherein said at least one target metric comprises chip slack and wherein said n surrogate metrics comprise testing path slack.

4. The method of claim 3, wherein said determining of said optimal chip disposition criterion comprises:
   determining a disposition parameter based on said product quality loss constraint, said chip slack, said testing path slack, said general joint probability density function, a joint probability density function of said chip slack, and a joint probability density function of said testing path slack;
   computing said optimal yield based on said disposition parameter and said n surrogate metrics; and
   returning said optimal chip disposition criterion, based on said computing of said optimal yield, as a function of disposition density less than or equal to said disposition parameter.

5. The method of claim 4, wherein said general joint probability density function comprises a multivariate Gaussian distribution.

6. The method of claim 5, wherein said at least one target metric comprises a combined single target chip slack.

7. A method comprising:
   identifying, for an integrated circuit chip design for which manufacturing chip testing is to be optimized, at least one target metric;
   identifying, for said integrated circuit chip design for which manufacturing chip testing is to be optimized, at least one surrogate metric;
   modeling a relationship between said at least one target metric and said at least one surrogate metric using a general joint probability density function;
   determining a chip disposition criterion based on said general joint probability density function, said chip disposition criterion determining, for a given physical chip putatively manufactured in accordance with said design, based on said at least one surrogate metric for said given physical chip, whether said given physical chip is to be accepted or discarded during said manufacturing chip testing; and
   providing a system, wherein the system comprises at least one distinct software module, embodied in a non-transitory computer-readable storage medium, and wherein the distinct software module comprises a statistical analysis engine module;
   wherein:
      said determining of said chip disposition criterion is carried out by said statistical analysis engine module executing on at least one hardware processor of a computer;
      in said determining step, said chip disposition criterion comprises an optimal chip disposition criterion to maximize chip yield given a product quality loss constraint, thereby obtaining an optimal yield;
      said at least one target metric comprises chip slack and said at least one surrogate metric comprises testing path slack;
      said determining of said optimal chip disposition criterion comprises:
         determining a disposition parameter based on said product quality loss constraint, said chip slack, said testing path slack, said general joint probability density function, a joint probability density function of said chip slack, and a joint probability density function of said testing path slack;
         computing said optimal yield based on said disposition parameter and said surrogate metric; and
         returning said optimal chip disposition criterion, based on said computing of said optimal yield, as a function of disposition density less than or equal to said disposition parameter;
      said general joint probability density function comprises a multivariate Gaussian distribution; and said at least one target metric comprises a first target chip slack based on a setup test and a second target chip slack based on a hold test.

8. The method of claim 1, wherein, in said determining step, said chip disposition criterion comprises an optimal chip disposition criterion to minimize product quality loss given a chip yield constraint.

9. The method of claim 1, further comprising:
measuring said n surrogate metrics for said given physical chip; and
accepting or discarding said given physical chip in accordance with said chip disposition criterion.

10. A method comprising:
identifying, for an integrated circuit chip design for which manufacturing chip testing is to be optimized, at least one target metric;
identifying, for said integrated circuit chip design for which manufacturing chip testing is to be optimized, at least one surrogate metric;
modeling a relationship between said at least one target metric and said at least one surrogate metric using a general joint probability density function;
determining a chip disposition criterion based on said general joint probability density function, said chip disposition criterion determining, for a given physical chip putatively manufactured in accordance with said design, based on said at least one surrogate metric for said given physical chip, whether said given physical chip is to be accepted or discarded during said manufacturing chip testing;
measuring said at least one surrogate metric for said given physical chip;
accepting or discarding said given physical chip in accordance with said chip disposition criterion; and
providing a system, wherein the system comprises a plurality of distinct software modules, embodied in a non-transitory computer-readable storage medium, and wherein the distinct software module comprise a statistical analysis engine module, a data acquisition module, and an input/output module;
wherein:
said determining of said chip disposition criterion is carried out by said statistical analysis engine module executing on at least one hardware processor of a computer;
said measuring of said at least one surrogate metrics is carried out by said data acquisition module executing on said at least one hardware processor; and
said accepting or discarding said given physical chip is facilitated by said input/output module executing on said at least one hardware processor.

11. A computer program product comprising a non-transitory computer readable storage medium having computer readable program code embodied therewith, said computer readable program code comprising:
computer readable program code configured to obtain, for an integrated circuit chip design for which manufacturing chip testing is to be optimized, at least one target metric;
computer readable program code configured to obtain, for said integrated circuit chip design for which manufacturing chip testing is to be optimized, n surrogate metrics in an n-dimensional surrogate metric space, n being at least two;
computer readable program code configured to model a relationship between said at least one target metric and said n surrogate metrics using a general joint probability density function; and
computer readable program code configured to determine a chip disposition criterion based on said general joint probability density function, said chip disposition criterion comprising an acceptance region in said n-dimensional surrogate metric space which is unbounded by fixed threshold values and which determines, for a given physical chip putatively manufactured in accordance with said design, based on said n surrogate metrics for said given physical chip, whether said given physical chip is to be accepted or discarded during said manufacturing chip testing.

12. The computer program product of claim 11, wherein, in said computer readable program code configured to determine, said chip disposition criterion comprises an optimal chip disposition criterion to maximize chip yield given a product quality loss constraint, thereby obtaining an optimal yield.

13. The computer program product of claim 12, wherein said at least one target metric comprises chip slack and wherein said n surrogate metrics comprise testing path slack, and wherein said computer readable program code configured to determine comprises:
computer readable program code configured to determine a disposition parameter based on said product quality loss constraint, said chip slack, said testing path slack, said general joint probability density function, a joint probability density function of said chip slack, and a joint probability density function of said testing path slack;
computer readable program code configured to compute said optimal yield based on said disposition parameter and said n surrogate metrics; and
computer readable program code configured to return said optimal chip disposition criterion, based on said computing of said optimal yield, as a function of disposition density less than or equal to said disposition parameter.

14. The computer program product of claim 13, wherein said general joint probability density function comprises a multivariate Gaussian distribution.

15. The computer program product of claim 14, wherein said at least one target metric comprises a combined single target chip slack.

16. A computer program product comprising a non-transitory computer readable storage medium having computer readable program code embodied therewith, said computer readable program code comprising:
computer readable program code configured to obtain, for an integrated circuit chip design for which manufacturing chip testing is to be optimized, at least one target metric;
computer readable program code configured to obtain, for said integrated circuit chip design for which manufacturing chip testing is to be optimized, at least one surrogate metric;
computer readable program code configured to model a relationship between said at least one target metric and said at least one surrogate metric using a general joint probability density function; and
computer readable program code configured to determine a chip disposition criterion based on said general joint probability density function, said chip disposition criterion determining, for a given physical chip putatively manufactured in accordance with said design, based on said at least one surrogate metric for said given physical chip, whether said given physical chip is to be accepted or discarded during said manufacturing chip testing; wherein:

in said computer readable program code configured to determine, said chip disposition criterion comprises an optimal chip disposition criterion to maximize chip yield given a product quality loss constraint, thereby obtaining an optimal yield;

said at least one target metric comprises chip slack and said at least one surrogate metric comprises testing path slack;

said computer readable program code configured to determine comprises:

computer readable program code configured to determine a disposition parameter based on said product quality loss constraint, said chip slack, said testing path slack, said general joint probability density function, a joint probability density function of said chip slack, and a joint probability density function of said testing path slack;

computer readable program code configured to compute said optimal yield based on said disposition parameter and said surrogate metric; and computer readable program code configured to return said optimal chip disposition criterion, based on said computing of said optimal yield, as a function of disposition density less than or equal to said disposition parameter;

said general joint probability density function comprises a multivariate Gaussian distribution; and said at least one target metric comprises a first target chip slack based on a setup test and a second target chip slack based on a hold test.

17. The computer program product of claim 11, wherein, in said computer readable program code configured to determine, said chip disposition criterion comprises an optimal chip disposition criterion to minimize product quality loss given a chip yield constraint.

18. The computer program product of claim 11, further comprising:

computer readable program code configured to measure said n surrogate metrics for said given physical chip; and computer readable program code configured to facilitate accepting or discarding said given physical chip in accordance with said chip disposition criterion.

19. An apparatus comprising:
a memory; and
at least one processor, coupled to said memory, and operative to:

obtain, for an integrated circuit chip design for which manufacturing chip testing is to be optimized, at least one target metric;

obtain, for said integrated circuit chip design for which manufacturing chip testing is to be optimized, n surrogate metrics in an n-dimensional surrogate metric space, n being at least two;

model a relationship between said at least one target metric and said n surrogate metrics using a general joint probability density function; and determine a chip disposition criterion based on said general joint probability density function, said chip disposition criterion comprising an acceptance region in said n-dimensional surrogate metric space which is unbounded by fixed threshold values and which determines, for a given physical chip putatively manufactured in accordance with said design, based on said n surrogate metrics for said given physical chip, whether said given physical chip is to be accepted or discarded during said manufacturing chip testing.

20. The apparatus of claim 19, wherein said at least one processor is further operative to:

measure said n surrogate metrics for said given physical chip; and facilitate accepting or discarding said given physical chip in accordance with said chip disposition criterion.

21. The apparatus of claim 20, wherein said at least one target metric comprises chip slack and wherein said n surrogate metrics comprise testing path slack, and wherein said at least one processor is operative to determine said optimal chip disposition criterion by:

determining a disposition parameter based on said product quality loss constraint, said chip slack, said testing path slack, said general joint probability density function, a joint probability density function of said chip slack, and a joint probability density function of said testing path slack;

computing said optimal yield based on said disposition parameter and said n surrogate metrics; and returning said optimal chip disposition criterion, based on said computing of said optimal yield.

22. An apparatus comprising:
a memory;
at least one processor, coupled to said memory, and operative to:

obtain, for an integrated circuit chip design for which manufacturing chip testing is to be optimized, at least one target metric;

obtain, for said integrated circuit chip design for which manufacturing chip testing is to be optimized, at least one surrogate metric;

model a relationship between said at least one target metric and said at least one surrogate metric using a general joint probability density function;

determine a chip disposition criterion based on said general joint probability density function, said chip disposition criterion determining, for a given physical chip putatively manufactured in accordance with said design, based on said at least one surrogate metric for said given physical chip, whether said given physical chip is to be accepted or discarded during said manufacturing chip testing;

measure said at least one surrogate metric for said given physical chip; and facilitate accepting or discarding said given physical chip in accordance with said chip disposition criterion; and a plurality of distinct software modules, each of the distinct software modules being embodied on a non-transitory computer-readable storage medium, wherein the distinct software modules comprise a statistical analysis engine module, a data acquisition module, and an input/output module;

wherein:

said at least one processor is operative to determine said chip disposition criterion by executing said statistical analysis engine module;

said at least one processor is operative to measure said surrogate metrics by executing said data acquisition module; and said at least one processor is operative to facilitate accepting or discarding said given physical chip by executing said input/output module.

23. An apparatus comprising:
means for obtaining, for an integrated circuit chip design for which manufacturing chip testing is to be optimized, at least one target metric;
means for obtaining, for said integrated circuit chip design for which manufacturing chip testing is to be optimized, n surrogate metrics in an n-dimensional surrogate metric space, n being at least two;
means for modeling a relationship between said at least one target metric and said n surrogate metrics using a general joint probability density function; and
means for determining a chip disposition criterion based on said general joint probability density function, said chip disposition criterion comprising an acceptance region in said n-dimensional surrogate metric space which is unbounded by fixed threshold values and which determines, for a given physical chip putatively manufactured in accordance with said design, based on said n surrogate metrics for said given physical chip, whether said given physical chip is to be accepted or discarded during said manufacturing chip testing;
wherein at least said means for determining comprise at least one of:
a dedicated hardware module; and
a distinct software module, embodied on a non-transitory computer readable storage medium, and executable on at least one hardware processor.

24. The apparatus of claim 23, wherein, in said means for determining, said chip disposition criterion comprises an optimal chip disposition criterion to maximize chip yield given a product quality loss constraint, thereby obtaining an optimal yield.

25. The apparatus of claim 23, wherein, in said means for determining, said chip disposition criterion comprises an optimal chip disposition criterion to minimize product quality loss given a chip yield constraint.

* * * * *